(12) United States Patent
Shepard

(10) Patent No.: US 9,679,946 B2
(45) Date of Patent: Jun. 13, 2017

(54) 3-D PLANES MEMORY DEVICE

(71) Applicant: HGST, Inc., San Jose, CA (US)

(72) Inventor: Daniel R. Shepard, North Hampton, NH (US)

(73) Assignee: HGST, Inc., San Jose, CA (US)

( * ) Notice: Subject to any disclaimer, the term of this patent is extended or adjusted under 35 U.S.C. 154(b) by 0 days.

(21) Appl. No.: 14/835,642

(22) Filed: Aug. 25, 2015

(65) Prior Publication Data

US 2016/0056206 A1 Feb. 25, 2016

Related U.S. Application Data

(60) Provisional application No. 62/041,306, filed on Aug. 25, 2014.

(51) Int. Cl.
| | | |
|---|---|---|
| *H01L 21/00* | (2006.01) | |
| *H01L 27/24* | (2006.01) | |
| *H01L 21/768* | (2006.01) | |

(52) U.S. Cl.
CPC ...... *H01L 27/249* (2013.01); *H01L 21/76883* (2013.01); *H01L 21/76805* (2013.01); *H01L 21/76831* (2013.01); *H01L 21/76877* (2013.01)

(58) Field of Classification Search
CPC ............. H01L 27/249; H01L 21/76883; H01L 21/76805
See application file for complete search history.

(56) References Cited

U.S. PATENT DOCUMENTS

| | | | | |
|---|---|---|---|---|
| 6,352,916 B1* | 3/2002 | Tang | ................. | H01L 21/76801 257/E21.576 |
| 7,682,981 B2* | 3/2010 | Shepard | ................. | B82Y 10/00 216/44 |
| 7,829,262 B2* | 11/2010 | Tran | .................... | H01L 21/0337 430/311 |
| 8,426,118 B2* | 4/2013 | Tran | .................... | H01L 21/0337 430/317 |
| 8,609,324 B2* | 12/2013 | Tran | .................... | H01L 21/0337 430/317 |
| 8,765,598 B2* | 7/2014 | Smith | ............... | H01L 27/11548 257/700 |
| 8,791,010 B1* | 7/2014 | Herner | .................... | H01L 45/04 438/618 |
| 8,878,162 B2* | 11/2014 | Bradley | ................. | B82Y 10/00 257/40 |

(Continued)

*Primary Examiner* — Laura Menz
(74) *Attorney, Agent, or Firm* — Patterson & Sheridan, LLP; Steven H. VerSteeg

(57) ABSTRACT

The present invention is a means and a method for manufacturing large three dimensional memory arrays. The present invention is a means and a method for addressing the WL and BL resistance by creating arrays having not only large plane conductors for each of the memory layers (WLs) but also for the opposite polarity common layer (BL). The present invention is also a means and a method to form via interconnections between the substrate logic and the respective layers of a multidimensional array. The present invention is also a way to operate an array in which the select device is unipolar but the array is above to be operated in a bipolar way. This facilitates a bipolar operation for memory cell technologies such as Resistive RAM (e.g., RRAM, ReRAM and Memresistors).

8 Claims, 6 Drawing Sheets

(56) References Cited

U.S. PATENT DOCUMENTS

| | | | |
|---|---|---|---|
| 8,969,127 B2* | 3/2015 | Stone | H01L 51/0004 156/234 |
| 2007/0049035 A1* | 3/2007 | Tran | H01L 21/0337 438/696 |
| 2008/0035970 A1* | 2/2008 | Wang | H01L 21/32051 257/295 |
| 2011/0014574 A1* | 1/2011 | Tran | H01L 21/0337 430/315 |
| 2012/0184097 A1* | 7/2012 | Chen | H01L 27/11286 438/618 |
| 2012/0202347 A1* | 8/2012 | Ready | H01L 21/76898 438/666 |
| 2012/0306090 A1* | 12/2012 | Smith | H01L 27/11548 257/773 |
| 2013/0210228 A1* | 8/2013 | Tran | H01L 21/0337 438/675 |
| 2014/0021614 A1* | 1/2014 | Yu | H01L 21/76802 257/751 |
| 2014/0300006 A1* | 10/2014 | Smith | H01L 27/11548 257/774 |
| 2016/0056206 A1* | 2/2016 | Shepard | H01L 27/249 257/773 |

\* cited by examiner

3-D PLANES MEMORY DEVICE

CROSS-REFERENCE TO RELATED APPLICATIONS

This application claims benefit of U.S. Provisional Patent Application Ser. No. 62/041,306, filed Aug. 25, 2014, which is herein incorporated by reference.

This application makes reference to and incorporates herein by reference in its entirety, U.S. Provisional Patent Application No. 61/209,725 by Shepard, entitled "$4F^2$ Memory Cells Comprising Three or Four Terminal Active Devices", filed Mar. 10, 2009, U.S. Provisional Patent Application No. 61/275,169 by Shepard, entitled "3-D Resistive Change Memory", filed Aug. 26, 2009, U.S. Pat. No. 7,376,008 by Shepard, entitled "SCR Matrix Storage Device, issued May 20, 2008, and U.S. Pat. No. 7,682,981 by Shepard, entitled "Topography Transfer Method With Aspect Ratio Scaling" issued Mar. 23, 2010.

TECHNICAL FIELD

In various embodiments, the present invention relates to 3-D memory devices, and more particularly to 3-D memory devices with large numbers of layers.

BACKGROUND

As advanced continue to be made in the area of semiconductor memory devices, high capacity and low cost is increasingly important. Small memory cells arranged in large arrays that are stacked three dimensionally is an approach to building density. Memory cell designs having a footprint no larger than $4F^2$ are increasingly desired to provide high density. However, because of parasitic resistance in bit lines and word lines, increasingly large arrays result in non-negligible voltage drops across these bit lines and word lines. When building 3-D memory arrays, these voltage drops are compounded by the many layers. Furthermore, the many layers must be interconnected to logic built into the substrate and the associated cost of masks, lithography and processing increases the cost per bit.

Low Impedance Paths to and from Memory Cell Elements

In the parlance of semiconductors, resistance of a wire is often quoted "per square." As is well known to those in the art, a square of material is a portion of that material having equal measures in both the x and y directions. Material resistance is quoted in squares (i.e., ohms per square or $\Omega/\square$) because as long as the x and y direction measurements are equal and the material thickness is unchanged (where thickness is measured in the z direction), the resistance across that square of material will be the same regardless of the size of that square. With this in mind, the resistances of a wire of such material is equal to the length of that wire (measured in squares—i.e., the number of squares that the wire is long) multiplied by the resistance per square.

Referring to FIG. 1, a single memory cell from a memory array is shown with its associated Word Line and Bit Line. In this figure, a Bit Line (BL) is formed in the substrate material. Doped semiconductor material can have resistance values ranging from 70 $\Omega/\square$ to 100 $\Omega/\square$. A Bit Line in a memory tile that is 1000 memory cells by 1000 memory cells can therefore have an end-to-end resistance of 14 k$\Omega$ to 20 k$\Omega$ (2000 squares×70 $\Omega/\square$ to 100 $\Omega/\square$ where each memory cell is two squares across to account for the width of the orthogonal Word Line, WL, and the space between the WL's) with the average resistance to any memory cell (one in the middle of the array) being approximately 8.5 k$\Omega$ From Ohms Law (V=IR), if a current through the memory cell is 100 $\mu$A, the voltage drop across this average resistance will be approximately 0.85 volts and to a cell at the far end of the line, 1.7 volts. If three layers of memory cells as shown in FIG. 2 were to pass a current of 100 $\mu$A, this voltage drop would triple to 2.55 volts—a large parasitic voltage for an integrated circuit memory array (5.1 volts to the far end).

Similarly in FIG. 1, a Word Line (WL) is formed in the top connected metal material. Metals can have resistance values ranging from 0.1 $\Omega/\square$ to 0.3 $\Omega/\square$. A Word Line in a memory tile that is 1000 memory cells by 1000 memory cells can therefore have an end-to-end resistance of 100 $\Omega$ to 300 $\Omega$ (2000 squares×0.1 $\Omega/\square$ to 0.3 $\Omega/\square$ where each memory cell is two squares long to account for the width of the orthogonal Bit Line, BL, and the space between the BL's) with the average resistance to any memory cell (one in the middle of the array) being approximately 100$\Omega$. Again from Ohms Law, if a current through the memory cell is 100 $\mu$A, the voltage drop across this average resistance will be approximately 0.01 volts. Even though this WL voltage drop is small, it contributes to the possibility of sneak paths forming. A sneak path is when sneak current flows into the read sense circuit along paths other than the intended path through an addressed memory element (i.e., by passing through unaddressed memory elements). While a sneak current is often very small, in a very large memory array, and in particular a very large memory array that is three dimensionally stacked, the sum of all sneak currents can be sufficient to make reading (i.e., measuring) the current passing through an addressed memory cell problematic. A solution is needed for a 3-D memory array that minimizes or eliminates the impact of sneak currents.

Bipolar Operation of Memory Cell Elements in Unipolar Arrays

In addition to the resistance problems, cross-point arrays will typically have unipolar (i.e., diode or BJT) select devices. Diodes generally limit current flow to one direction resulting in unipolar memory cell operation. While some memory cell materials, such as phase change materials, work well in a unipolar environment, other materials such as resistive RAM (ReRAM) materials, while they can be made to work in a unipolar environment (if formed filaments are removed by fuse-blowing those filaments), can work better in a bipolar environment.

Memory Layer Planes Interconnect to Substrate

Another problem to address with large 3-D memory arrays is the interconnection of the various layers with the substrate whereby the many layers must be interconnected to logic built into the substrate and the associated costs of masks, lithography and processing increases the cost per bit. One approach to addressing these costs is stair step formation through repeated etching. Recent 3-D NAND solutions illustrate this technique (e.g., see http://thememoryguy.com/3d-nand-how-do-you-access-the-control-gates/).

Referring to FIG. 3, the layers of the memory array (consisting of alternating layers of dielectric, such as silicon dioxide, and conductive material, such as polysilicon) are deposited on top of a wafer having the array's control logic already formed in its surface (FIG. 3a). A thicker hard mask material on the surface is photolithographically patterned and anisotropically etched ($etch_{mask1}$) to create an opening at the edge of the array where vias are to be formed (FIG. 3b). Next, the first oxide layer is etched ($etch_{Ox1}$) using an anisotropic oxide etch that stops on silicon (FIG. 3c), followed by etching the first poly layer ($etch_{Poly1}$) using an anisotropic silicon etch that stops on oxide (FIG. 3d). Once the surface is initially set up in this way, the hard mask is etched sideways with an isotropic etch in a step called a "pull-back" etch (etch$_{Mask2}$) as is shown in FIG. 3e; the hard mask material thickness is selected to ensure that some hard mask material will survive the entire etch process. The pull-back etch distance is equal to a single stair step width. Typically, to handle process variations, the width of a single stair is wider than what would be the case in a traditional planar process to ensure that vias (added later in the process) are guaranteed to and upon (i.e., within the footprint of) their respective stair step. Again, oxide layers are anisotropically etched (etch$_{Ox2}$) to the top of the next polysilicon layers (Step f) and etch on through (etch$_{Poly2}$) the now exposed polysilicon to the next underlying oxide layers (Step g), noting that the exposed first stair step etches down to the second layer, while the newly-exposed second stair step etches down to the first poly layer. This sequence of pull-back, oxide and poly etch is repeated until the entire stack has been etched into a terraced stair-step pattern (FIG. 3h). Finally, a thick dioxide layer is deposited (deposit$_{Ox}$) on top of the entire staircase and planarized (e.g., by CMP) and vias are photographically patterned (photo$_{Via1}$) and etched (etch$_{Via1}$) down to their respective polysilicon layer (the etch is selective to attach the oxide much faster than polysilicon, so each via opening effectively stops when a polysilicon layer is reached; such etches are well known to those skilled in the art). These vias openings are then filled (deposit$_{Via1}$) with conductive material (such as tungsten or polysilicon) and planarized (e.g., by CMP) to bring the connections to the surface where they can be wired to other vias that connect them down to the logic on the substrate (additional photo-lithographic patterning, etching, depositing and planarizing steps).

The total number of etch steps for this part of the process, where L is the number of layers, is defined by:

$$L(\text{etch}_{Mask} + \text{etch}_{Oxide} + \text{etch}_{Poly}) + \text{deposit} + \text{CMP} + \text{photo}_{Via} + \text{etch}_{Via} + \text{deposit}_{Via} + \text{CMP}_{Via}$$

A 32 layer device would therefore have at least 96 etch steps and total over 100 process steps for this part of the process. Present day volume production semiconductor processes use pull-back etch steps no more than once and the cumulative errors can be problematic. As a result, the stair step formation sequence is typically broken up into groups resulting in the actual number of steps being even higher.

This etch sequence uses a surface hard mask to create a stair step formation on the one side of the array, but because the hard mask naturally has more than one edge of its own (i.e., a square hard mask has four sides), this stair step structure is formed on sides where it is not needed and the area associated with these other stair step structures can be wasted area resulting in a larger die size and greater cost per bit. Also, the stair steps must be larger than their associated vias, to account for the potential cumulative errors from the pull back etches resulting in an even greater die size. Lastly, the need to bring the vias to the surface, route them over to the edge beyond the stair step structure and then back down to the substrate (rather than having the vias simply drop down from each stair step directly to the substrate) even further increases the die size and cost per bit.

The present invention is a solution to the WL and BL resistance problem to enable larger arrays and greater numbers of 3-D stacking layers. The present invention is also a stair-step forming solution that can constrain the size of the step to being only two critical dimension (CD) features in width while limiting the creating of the stair step structure to be formed only where needed and with the via connection to the stair step dropping directly down to the substrate without additional routing. The present invention is also a solution that enables operating a cross-point array in a bipolar manner.

SUMMARY

The present invention is a means and a method for manufacturing large three dimensional memory arrays. The present invention is a means and a method for addressing the WL and BKL resistance by creating arrays having not only large plane conductors for each of the memory layers (WLs) but also for the opposite polarity common layer (BL). In this way, the current path is from the first conductive material of a memory layer plane, through the memory cell, and down to a large common plane area of the substrate, where both the first conductive memory plane layer and the substrate plane area have a resistance of approximately one square of their respective material; only the row and column selection paths are through higher resistance WL and BL conductors. From the above example, the impedance of the memory layer plane to the memory cell would generally be less than one ohm and the impedance of the substrate plane from the memory cell would generally be around 100 ohms.

The present invention is also a means and a method to form via interconnections between the substrate logic and the respective layers of a multidimensional array while utilizing (i) a single traditional planar photolithography and etch step to define the via locations, (ii) a simple two layer deposition and planarization step to form all of the vias between the substrate and their respective memory plane layer (iii) a single imprint lithography and transfer etch step (i.e., See U.S. Pat. No. 7,682,981 by Shepard titled "Topography transfer method with aspect ratio scaling") to define the stair step within those critical dimensions set by that single traditional planar photolithography step used to define the via locations (and nowhere else), and (iv) only three etches, two depositions and a single planarization to complete the sequence. The present invention will therefore have only 5 etch steps and a total of only about 13 process steps and will create via connections between the memory plane layers and the substrate in a minimal area of the die. The present invention will be useful for many information storage technologies that require high density.

The present invention is also a way to operate an array in which the select device is unipolar but the array is to be operated in a bipolar way. This facilitates a bipolar operation for memory cell technologies such as Resistive RAM (e.g., RRAM, ReRAM and Memresistors).

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawing, in which.

DETAILED DESCRIPTION

Memory Layer Planes Interconnect to Substrate

Figure 1:
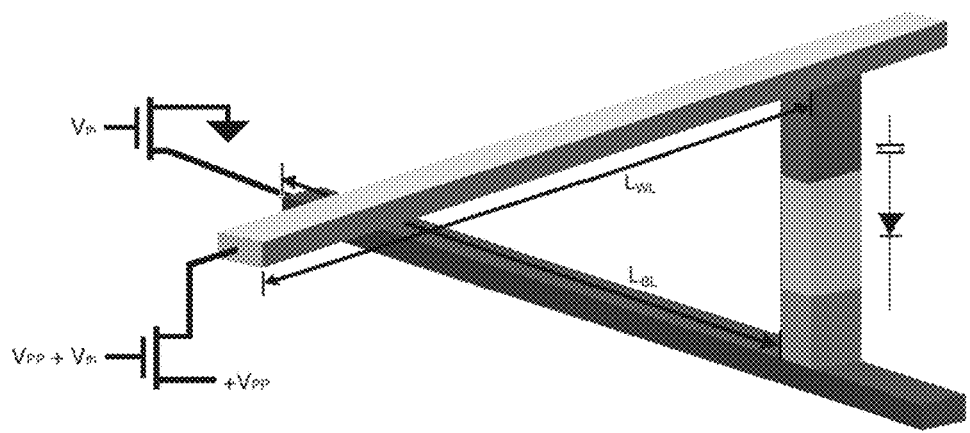
FIG. 1 depicts a memory cell connected from above by a Word Line and from below by a Bit Line.
Figure 2A:
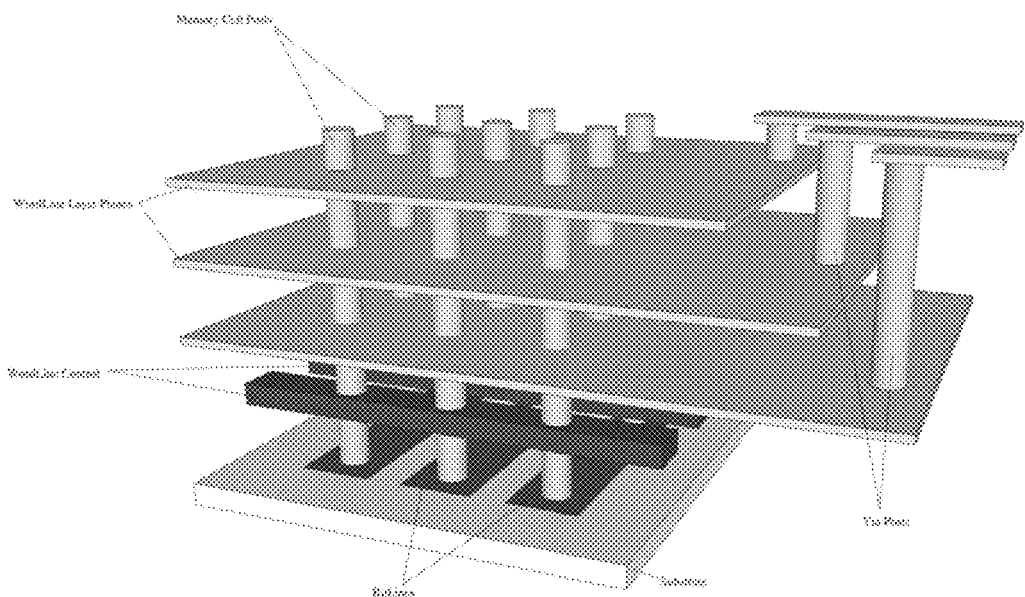
FIG. 2A depicts a 3-D memory array based on a plurality of memory layers comprising conductive memory planes (as opposite to a plurality of memory layers comprising each layer comprising a plurality of Word Lines) with Bit Lines in the substrate.
Figure 2B:
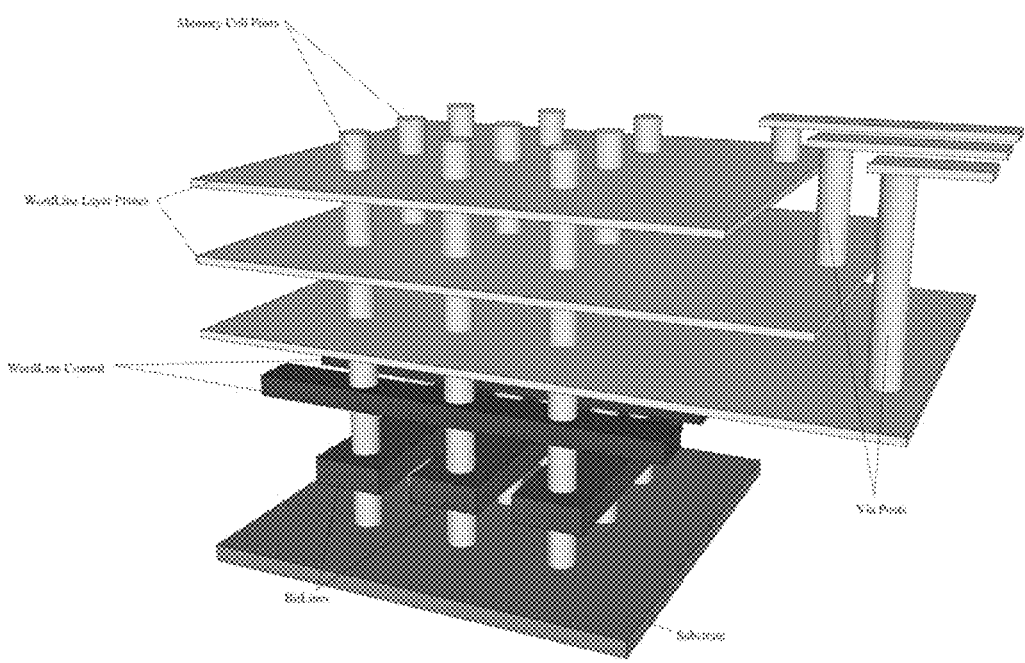
FIG. 2B depicts a 3-D memory array based on a plurality of memory layers comprising conductive memory planes (as opposite to a plurality of memory layers comprising each layer comprising a plurality of Word Lines) with a single square substrate contact and Word Line and Bit Line selection lines.
Figure 3:
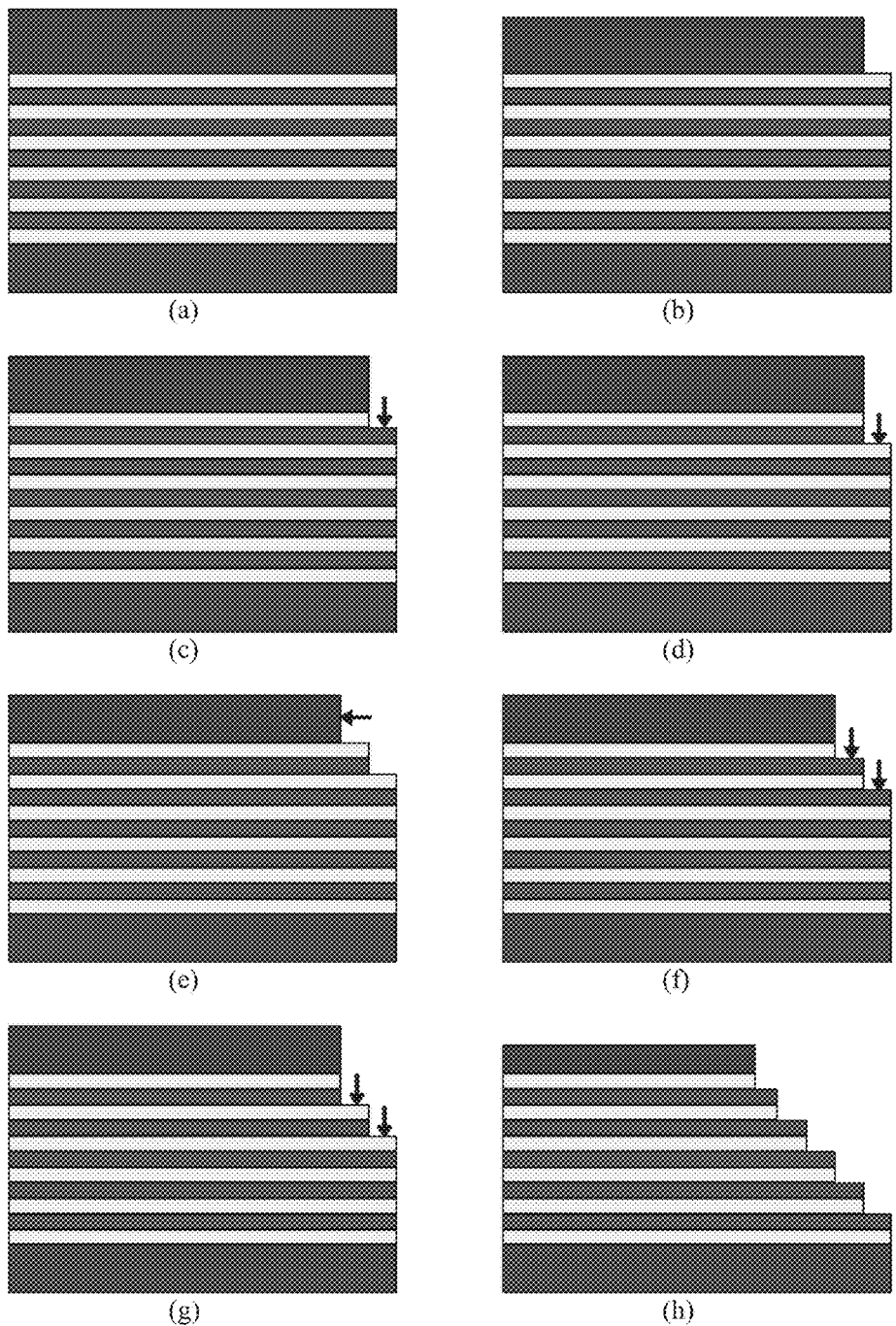
FIG. 3 shows a cross sectional representation of a prior art approach depicting the steps for forming a stair step using a pull back etch approach.
Figure 4A:
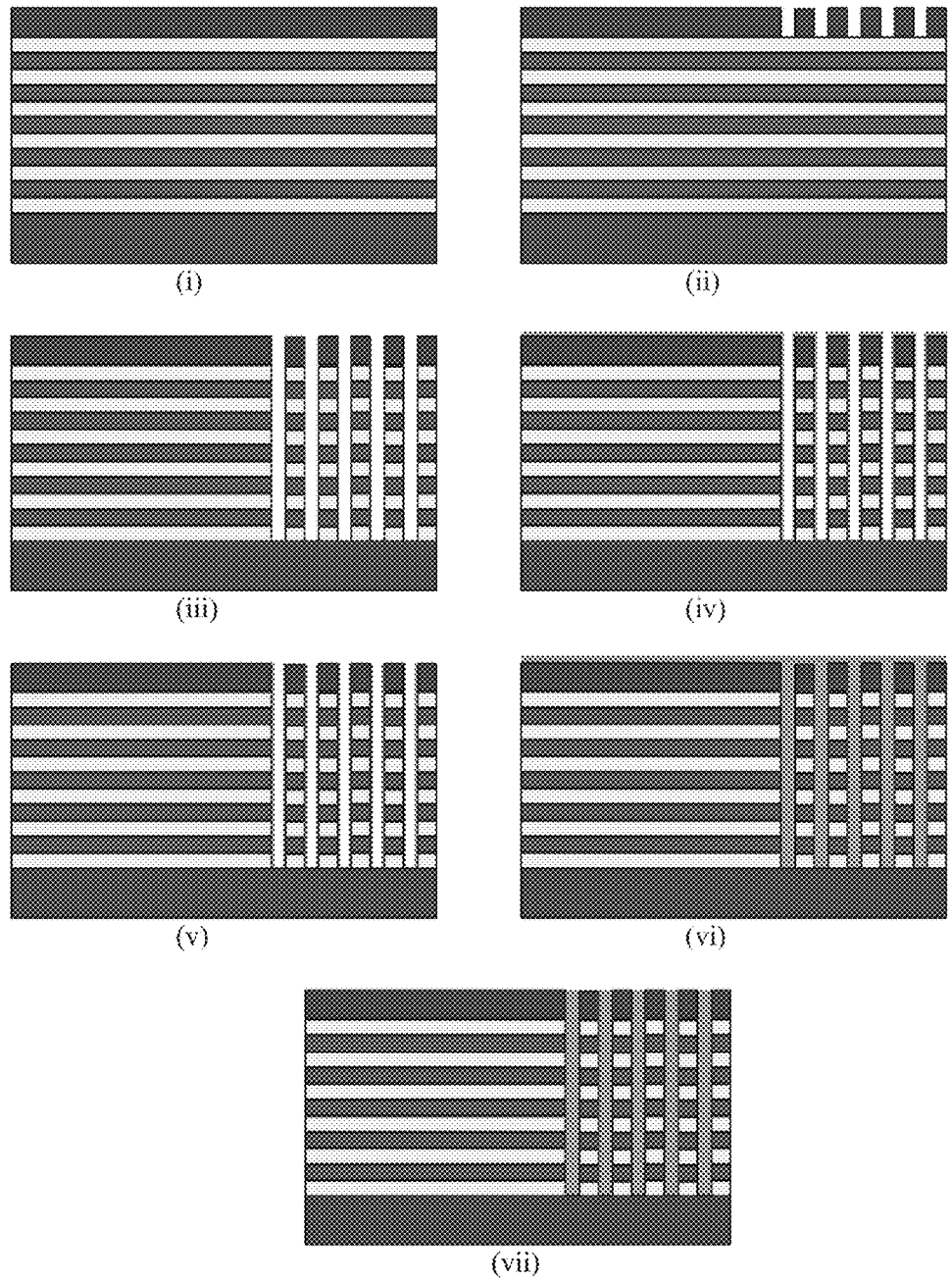
FIG. 4A-4C shows the sequence of steps used to create a plurality of stair stepped via connections to a plurality of memory plane layers.

With the present invention as with other layered memory designs, alternating layers of conductive and insulating materials are deposited on the wafer, topped by a hard mask material (FIG. 4Ai), whereby each conductive layer plane corresponds to a layer of memory elements. As is done to form the vertical NAND memory elements in a 3-D NAND or VNAND device, holes are patterned (FIG. 4Aii) and etched down through the plurality of layers to the substrate (so too is an outer perimeter to the array which encompasses the portion of the arrays where the vias are located), but in the case of the present invention, the holes are positioned at the locations where vias between the substrate logic and the respective memory layers are desired. These via holes are etched through all of the memory layer planes (FIG. 4Aiii).

With the present invention, these holes are lined with a sidewall dielectric material (FIG. 4Aiv) and then etched back with a side wall spacer etch (FIG. 4Av) as is well known to those skilled in the art. The remaining center portion is then filled (FIG. 4Avi) with a conductive material (such as tungsten or polysilicon) and the surface is planarized (FIG. 4Avii) resulting in isolated conductive posts running vertically through all of the memory layer planes at, above and connecting to their respective connection points within the substrate logic.

Figure 4B:
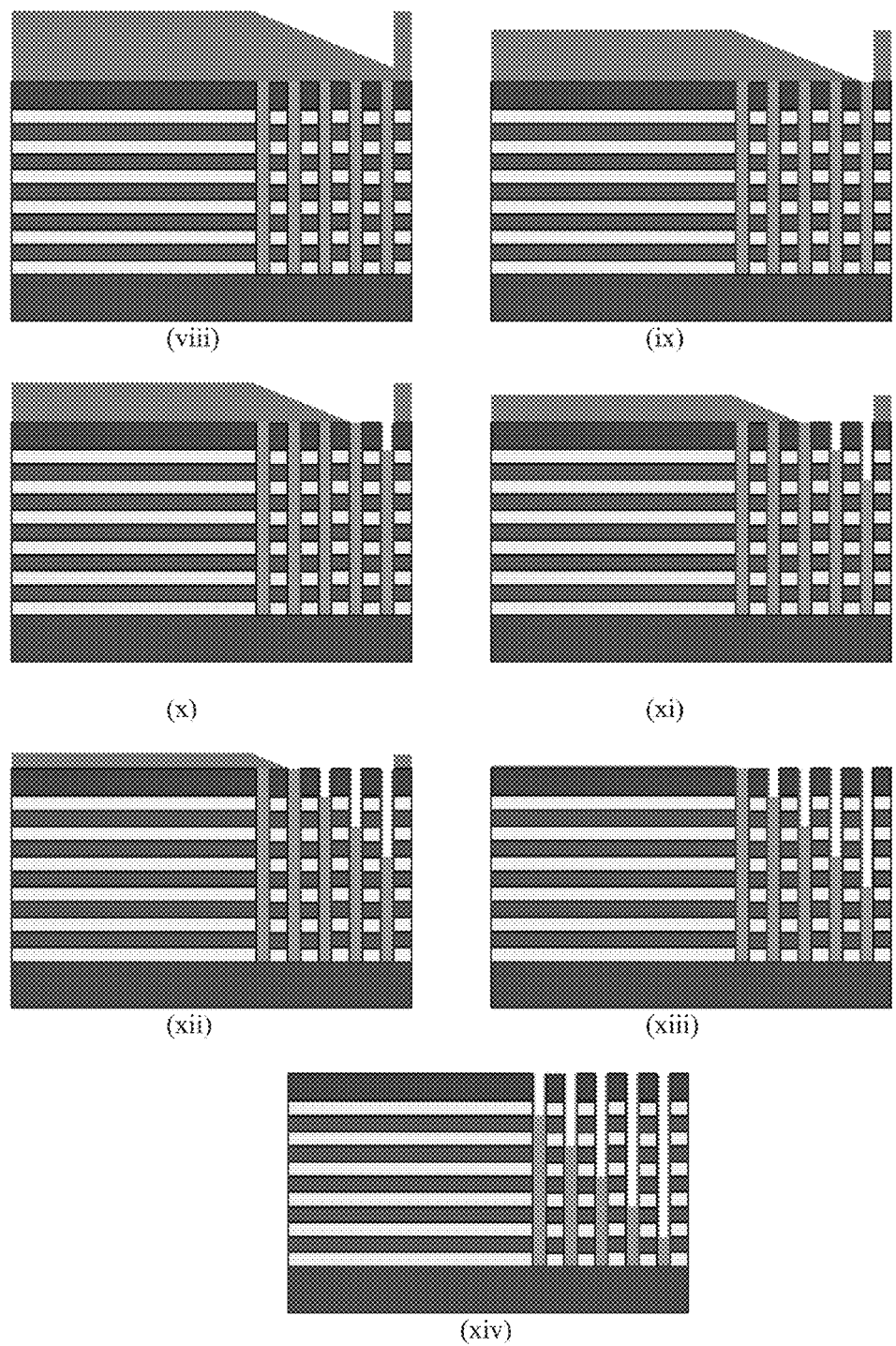
Figure 4C:
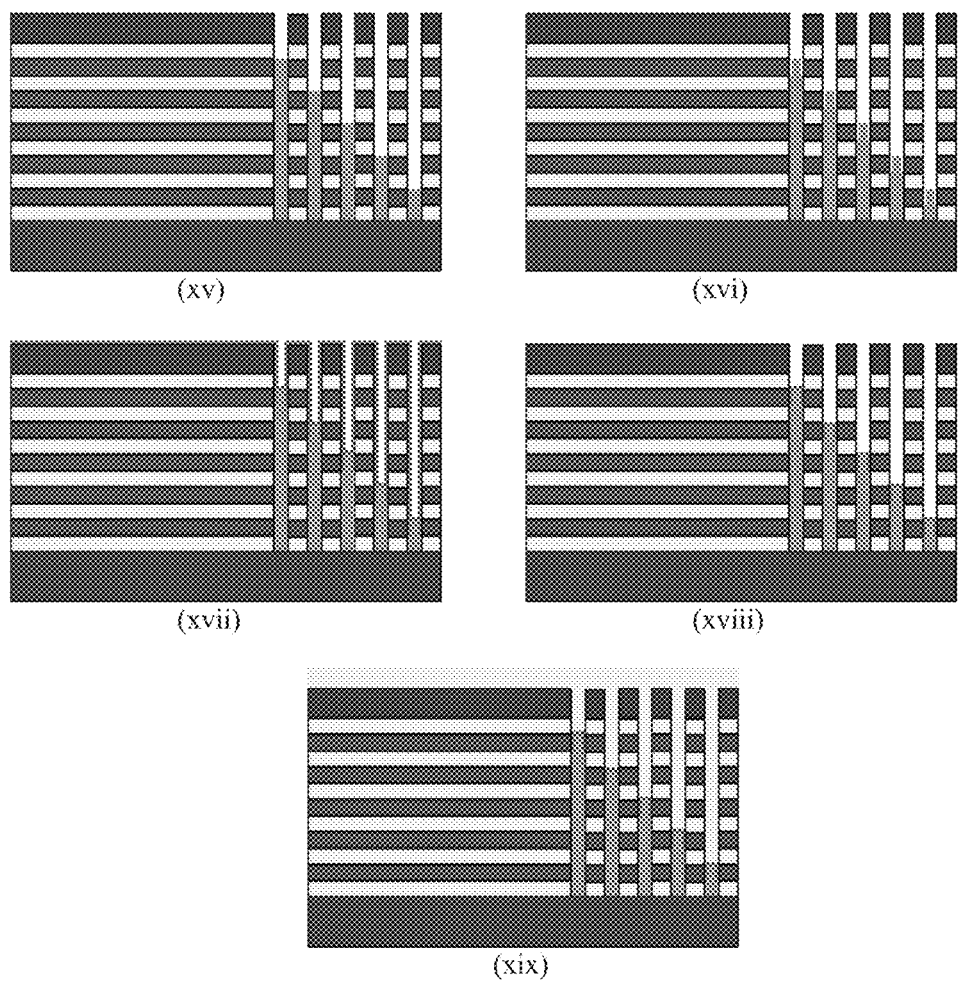

At this point, a nanoimprint lithography (NIL) step is performed. The imprint stamper topography comprises a ramp or stair step that extends across the area where the via posts are exposed at the surface (by extending across the performed via posts with a single ramp, alignment of the NIL step is less critical). Then, using a topography pattern transfer technique (as is disclosed in U.S. Pat. No. 7,682,981 by Shepard titled "Topography transfer method with aspect ratio scaling" that issued on Mar. 23, 2010), this ramp or stair step pattern is imprinted—into a spun-on or sprayed-on polymer material such as a photoresist material—over the tops of the via posts (FIG. 4Bviii). Using etches that are well known to those skilled in the art and, in particular, an etch that is selective to remove the conductive via material much faster than the dielectric material and that will also etch the polymer material at a known rate. As this pattern transfer etch progresses, this thin end of the polymer ramp will be etched away first (FIG. 4Bix) thereby exposing the underlying conductive via post material. Over the course of this etch (FIG. 4Bix-4BXiv), more and more of the polymer ramp material will be removed and as a result, the underlying conductive material of the via posts will be exposed to a longer etch time at the thin end of the ramp and a shorter etch time towards the thicker end of the ramp, where the via post etch time corresponds to the thickness of the ramp at the location of the corresponding via post. The result of this is that the top of a via post located near the thin end of a ramp will be etched deeply down and the top of a via post located near the thick end of the ramp will be slightly etched and remain near the surface. The ramp shape and the etch can be adjusted to control the resulting final post heights such that the tops of the via posts will end up adjacent to the memory layers plane to which the via is to be connected (FIG. 4Bxiv).

A brief isotropic dielectric etch is next employed to remove the sidewall dielectric material layer that was deposited to line the holes above the remaining via posts (FIG. 4Bxv) and then a brief anisotropic dielectric etch is employed to remove the sidewall dielectric material surrounding just the top of the via posts (FIG. 4Bxvi), that is to say, to remove the portion of the sidewall dielectric material remaining directly between the top of each via post and that post's corresponding memory layer plane. A brief conformal deposition of a conductive material will fill in this space between the top of each post and that post's corresponding memory layer plane (FIG. 4Bxvii) thereby completing the connection between each via and its memory layer as well as thinly coating the wall of the hole remaining above the posts. A brief isotropic etch targeted at the conductive material just deposited will remove the conductive material coating the wall of the hole remaining above the posts (and on the wafer surface), but the material that filled in the narrow gap between the top or each via post and that post's corresponding memory layer plane will not be removed (FIG. 4Bxviii) and the via post's top will continue to be connected to its respective memory layer plane. Finally, a dielectric deposition will fill in the holes remaining above the posts. This deposition can be followed by a planarization step to flatten the surface (FIG. 4Bxix).

An aspect of the NIL step is to set the initial height of the imprint ramp. A brief initial break-through etch will lower the polymer material and break through the polymer at its thinnest points, exposing the underlying surface. If the break-through etch is performed using an eth that is selective to each the polymer over the underlying materials (i.e., the metal posts and the hard mask material), an opening will be formed that has a width that can be measured (not in FIG. 4Bix at the right end of the ramp where the polymer has broken through; the width of this break-through area can be used to verify that the ramp is at the correct height such that real-time processing corrections can be made).

The present invention can be utilized with 3-D NANA, 3-D phase-change memory, 3-D Resistive RAM memory, and any other 3-D memory in which the layers must be interconnected to the substrate. The present invention can be sued with 3-D memory wherein the layers comprise planes of conductive material as well as with 3-0D memories wherein each layer comprises a plurality of individual Word Lines.

Bipolar Operation of Memory Cell Elements in Unipolar Arrays

The present invention is also a way to operate an array in which the selective device is unipolar but the array is operated in a bipolar way. The present invention incorporated a resistive connection to the tops of the vertical posts running through the vertically stacked memory elements in the array. This top resistive connection has high impedance and can therefore be negated by the activation of the low impedance path to ground to the large, one-square, grounded substrate connection plane. However, when the low impedance path to ground to the large, one-square, grounded substrate connection plate is not activated, the higher impedance top connection can be raised to a voltage above the voltage on the conductive memory plane layers, thereby reversing the voltage across the memory cell elements. This facilitates a bipolar operation for memory cell technologies such as Resistive RAM (e.g., RRAM, ReRAM or Memresistors).

Fabrication of this top resistive connection can be done after formation of the posts that run vertically through the memory cells and while those posts are still exposed at the surface. A blanket layer of resistive first conductive material (e.g., Titanium Nitride, TiN, or Tantalum Nitride, TaN, or the like) is deposited across and in contact with the tops of the posts and then a second highly conductive material (e.g., aluminum, copper, tungsten, doped polysilicon, or some other material, typically selected for compatibility with semiconductor processing) is deposited on top of that blanket layer of resistive first conductor material. This sandwich of resistive conductor material and conductive material can then optionally be patterned into smaller areas to enable biasing less than the full array (and to separate the materials from the rest of the device). The top conductive material is include for providing a more predictable resistance to posts that are near the edge verses in the center of the array, but for some applications this predictability may not be required and this second layer may be omitted. An electrical connection to these top resistive connections would be made with vias to control logic in the substrate.

It should be noted that a layer of non-conductive material could also be used whereby an electron tunneling or other quantum mechanical effect can be used to achieve the same effect; namely that of having a high impedance source to (i) apply a bias to the posts that will (ii) enable a reverse voltage to be applied to a memory element and that (iii) can be overridden by a lower impedance second source. It will be clear to those skilled in the art that this resistive connection need not be formed over the top of the posts but could be positioned at a different level in the 3-D array (e.g., below the memory layers or within the stack) to achieve the same electrical result with additional processing.

Low Impedance Paths to and from Memory Cell Elements

The present invention is a means and a method for addressing the WL and BL resistance by creating arrays having not only large plane conductors for each of the memory layers (WLs) but also for the opposite polarity common layer (BL). The opposite polarity common layer would typically be formed in the substrate (but, could be formed at any layer in the stack; e.g., a mid-stack level common layer could be formed utilizing deposited polysilicon thin film transistors, TFTs, as the select devices). In this way, the current path is from the first conductive material of a memory layer plane, through the memory cell, and down to a large common plane area of the substrate, where both the first conductive memory plane layer and the substrate plane area have a resistance of approximately one square of their respective material; only the row and column selection paths to control the select device at the bottom of each vertical conductive post are through higher resistance WL and BL conductors.

The 3-D layered stack would be fabricated by depositing layers and then etching holes down through the entire stack to select devices in the substrate. Select devices can, for example, be constructed as is disclosed in U.S. Provisional Patent Application 62/006,957 by Shepard titled "4F2 SCR Memory Device" that was filed on Jun. 3, 2014. These holes, once etched, can be sidewall coated (e.g., using a side wall spacer technique that will cover the walls of the hole but leave the bottoms of the holes opened, as is well known to those skilled in the art) and then the remaining center post area of the holes are filled with a conductive material (such as tungsten or polysilicon). Those skilled in the art will know techniques to make a low resistance "ohmic contact" between the post and the substrate connection point. In the case of a ReRAM 3-D memory device, the layers would be made of alternating metal and insulator where the metal layers would be the ReRAM material used to grow the filaments towards the center post. The side wall coating material in the holes would be the ReRAM insulator through which the filament would be grown.

Standard techniques well understood to those skilled in the art would then be employed to pattern, etch and interconnect the word lines, bit lines, and substrate connections, to form the holes, as well as to incorporate the information storage elements to be connected to the select devices in the substrate.

Embodiments may be implemented with a traditional two dimensional arrangement of storage elements, but are expected to be most beneficial with a three-dimensional arrangement of storage elements. In addition, a three dimensional implementation can be employed by layering information storage elements where any information storage element will be connected between the top positive supply voltage contacts corresponding to its layer and a vertical post connected to the select device. The select device will provide a low impedance path to ground for the vertical post passing through (but, electrically insulated from) the layers of top positive supply voltage layer contacts. Connecting between the vertical post and each top positive supply voltage contact layer would be an information storage element.

In a three dimensional implementation, the critical issue is that (i) the bottom circuit path is low impedance (i.e., the vertically rising post to the grounded substrate, inclusively) and that (ii) the top circuit path (i.e., to each 3-D plane layer) is also low impedance, and that (iii) connecting between the bottom circuit path and any top circuit path (i.e., between a 3-D plane and a vertically rising post through all 3-D layers) is a resistive information storage (memory) element; this is to ensure that a connection between the bottom circuit path and the top circuit path will show its voltage drop across the memory element as opposed to causing the voltage on any top circuit path to be pulled downward or causing the voltage on the bottom circuit path to be pulled upward. This will enable more 3-D layers to be included. The select device at the bottom of each post could be implemented as an SCR or as two transistors, vertically constructed and in series, where either or both transistors could be a MOS device or a BJT device.

The information storage elements may include a fusable material, an antifuseable material, a phase-change material (for PRAM) such as a chalcogenide alloy material (including a chalcogenide in which the programmed resistivity may be one of two resistance values and, in the case of more than one bit per cell storage cells, in which the programmed resistivity may be one or three or more resistance values), a resistive change material (for PRAM or ReRAM or Memristors), a ferroelectric material (for FRAM), a magnetic or magnetoresistive material (for MRAM), magnetic tunnel junction or spin-transfer torque element (for MTJ-RAM or STT-RAM). A dual layer oxide memory element comprising a junction and an insulating metal oxide and a conductive metal oxide (see U.S. Pat. No. 6,753,561 by Rinerson), or a trapped charge device (see U.S. Pat. No. 7,362,609 by Harrison, et al.). The phase-change material, such as a Chalcogenide material, may be programmed or erased. Orientation of the array may be rotated, i.e., the "rows" may be "columns," or vice versa. The polarity of the voltages and direction of the steering elements in the storage bits may be reversed while still keeping within what is envisioned by embodiments of the present invention. The present invention may be applied to other memory technologies as well including static RAM, Flash memory, EEPROM, DRAM, and others not mentioned, including memory technologies yet to be commercialized or invented.

Memory devices incorporated embodiments of the present invention may be applied to memory devices and systems for storing digital text, digital books, digital music (such as MP3 players and cellular telephones), digital audio, digital photographs (wherein one or more digital still images may be stored including sequences of digital images), digital video (such as personal entertainment devices), digital cartography (wherein one or more digital maps can be stored, such as GPS devices), and any other digital or digitized information as well as any combinations thereof. Devices incorporating embodiments of the present invention include computers, portable devices and solid state disk drives (SSD's). Devices incorporating embodiments of the present invention may be embedded or removable, and may be interchangeable among other devices that can access the data therein. Embodiments of the invention may be packaged in any variety of industry-standard form factor, including Compact Flash, Secure Digital, MultiMedia Cards, PCMCIA Cards, Memory Stick, PCIe cards, any of a large variety of integrated circuit packages including Ball Grid Arrays, Dual In-Line Packages (DIP), SOICs, PLCC, TQFPs and the like, as well as in proprietary form factors and custom designed packages. These packages may contain just the memory chip, multiple memory chips, one or more memory chips along with other logic devices or other storage devices such as PLDs, PLAs, micro-controllers, microprocessors, controller chips or chip-sets or other custom or standard circuitry.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A method for making connections between a plurality of layers and a layer below the plurality of layers comprising the steps of
   (i) creating a plurality of vertical interconnects and a polymer ramp, wherein the polymer ramp is disposed over the plurality of vertical interconnects,
   (ii) selectively etching back the vertical interconnects such that a vertical interconnect is proximate to or below one or more layers of the plurality of layers, wherein the selectively etching back comprises:
       etching the polymer ramp and exposing conductive material of the plurality of vertical interconnects; and
       etching the exposed conductive material, wherein exposed conductive material that is disposed under a thin area of the polymer ramp are etched for a longer time than exposed conductive material that is disposed under a thicker area of the polymer ramp, and
   (iii) connecting a vertical interconnect to a proximate layer, whereby each layer is electrically connected to the layer below the plurality of layers by at least one vertical interconnect.

2. The method of claim 1 whereby the layer below the plurality of layers comprises circuitry.

3. The method of claim 1 wherein the polymer ramp has a plurality of differing heights.

4. The method of claim 3 further comprising
   (i) applying a malleable material above the plurality of vertical interconnects, and
   (ii) applying a feature into the malleable material to form the polymer ramp.

5. The method of claim 4, whereby applying a feature comprises one or more of the steps of
   (i) applying a malleable material to the surface above the plurality of vertical interconnects and then applying a feature into the malleable material, and
   (ii) applying a malleable material to a surface feature and transferring the malleable material to an area above the plurality of vertical interconnects.

6. The method of claim 5 whereby applying a malleable material comprises one or more of pouring, dripping, spraying and spinning.

7. The method of claim 3 comprising the use of imprint lithography.

8. The method of claim 3 further comprising etching both the feature comprising a slope or stair-step or plurality of differing heights and the plurality of vertical interconnects such that the amount of etching of a vertical interconnect is related to the height of the feature comprising a slope or stair-step or plurality of differing heights above that vertical interconnect.

* * * * *